(12) United States Patent
Itakura et al.

(10) Patent No.: US 9,136,855 B2
(45) Date of Patent: Sep. 15, 2015

(54) AD CONVERTER

(71) Applicant: Kabushiki Kaisha Toshiba, Minato-ku, Tokyo (JP)

(72) Inventors: Tetsuro Itakura, Tokyo (JP); Masanori Furuta, Odawara (JP); Akihide Sai, Kawasaki (JP); Junya Matsuno, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/339,266

(22) Filed: Jul. 23, 2014

(65) Prior Publication Data

US 2015/0130649 A1  May 14, 2015

(30) Foreign Application Priority Data

Nov. 14, 2013 (JP) .................................. 2013-235937

(51) Int. Cl.
*H03M 1/60* (2006.01)
*H03M 1/06* (2006.01)

(52) U.S. Cl.
CPC .............. *H03M 1/0626* (2013.01); *H03M 1/60* (2013.01)

(58) Field of Classification Search
CPC ....... H03M 1/0626; H03M 1/60; H03M 1/00; H03M 2201/20
USPC ......................................... 341/155, 156, 157
See application file for complete search history.

(56) References Cited

U.S. PATENT DOCUMENTS 3,678,971 A * 7/1972 Nordgren ...................... 140/107
4,983,971 A * 1/1991 Przybysz et al. .............. 341/133
5,841,388 A * 11/1998 Yasuda et al. ................. 341/155
6,127,960 A    10/2000 Silver et al.
(Continued)

FOREIGN PATENT DOCUMENTS

JP          06-260850 A     9/1994
JP       2000-209094 A     7/2000
(Continued)

OTHER PUBLICATIONS

J. Hamilton, et al., "A Discrete-Time Input ΔΣ ADC Architecture Using a Dual-VCO-Based Integrator," IEEE Transactions on Circuits and Systems—II: Express Briefs, vol. 57, No. 11, Nov. 2010, pp. 848-852.

*Primary Examiner* — Jean B Jeanglaude
(74) *Attorney, Agent, or Firm* — Knobbe, Martens, Olson & Bear LLP

(57) ABSTRACT

In one embodiment, an AD converter includes a first (second) oscillation circuit, a first (second) counter, a first (second) arithmetic circuit, a first (second) subtracting circuit, an adder circuit, and a feedback circuit. The first oscillation circuit generates a first pulse signal having a frequency corresponding to a level of a first analog signal. The first counter counts the first pulse signal. The first arithmetic circuit generates a first signal corresponding to a change amount of a count value. The first subtracting circuit outputs a digital signal corresponding to a difference between the signals generated by the first and second arithmetic circuits. The adder circuit generates a sum signal of the signals generated by the first and second arithmetic circuits. The second subtracting circuit generates a difference signal between the sum signal and a reference signal. The feedback circuit inputs the difference signal to the first oscillation circuit.

13 Claims, 13 Drawing Sheets

(56) References Cited

U.S. PATENT DOCUMENTS

| | | | |
|---|---|---|---|
| 7,391,353 B2 * | 6/2008 | Suzuki | 341/155 |
| 2003/0201927 A1 * | 10/2003 | Watanabe et al. | 341/157 |

FOREIGN PATENT DOCUMENTS

| | | |
|---|---|---|
| JP | 2001-085953 A | 3/2001 |
| JP | 2004-297626 A | 10/2004 |

* cited by examiner ized.

AD CONVERTER

CROSS REFERENCE TO RELATED APPLICATION(S)

This application is based upon and claims the benefit of priority from the prior Japanese Patent Application No. 2013-235937, filed on Nov. 14, 2013, the entire contents of which are incorporated herein by reference.

FIELD

Embodiments described herein relate generally to an AD converter.

BACKGROUND

In the related art, there is a known AD converter including two oscillation circuits that generate a pulse signal having an oscillation frequency corresponding to a level of a received analog signal. In such an AD converter, the number of pulse signals generated by each of the two oscillation circuits for a predetermined period is counted by a counter. After that, a difference between count values of the two oscillation circuits is output as a digital signal. In this manner, the difference of the level between the analog signals received in the two oscillation circuits is converted to the digital signal.

In such an AD converter of the related art, each of the oscillation circuits may have a different oscillation frequency value of the pulse signal generated for the same level analog signal because of manufacturing variations of the oscillation circuits. For instance, an oscillation circuit is designed to generate a pulse signal having the oscillation frequency 10 MHz with respect to an analog signal of a specific level, but sometimes pulse signal having the oscillation frequency 11 MHz may be actually generated with respect to the analog signal of the specific level. Also, there is a case in which a bias component contained in the received analog signal may differ from the design value. In the event of such manufacturing variations of the oscillation circuits or the difference generated in the bias component, there is possibility that each AD converter may have a different digital value to be output during a no signal period when no signal component is contained in the analog signal.

Moreover, a value of the oscillation frequency of the pulse signal generated with respect to the analog signal of the same level may be different between the two oscillation circuits included in the AD converter, and the difference of the oscillation frequency may cause offset in the digital signal to be output. For instance, in the case where one oscillation circuit generates a pulse signal of 10 MHz with respect to an analog signal and the other oscillation circuit generates a pulse signal of 10.1 MHz with respect to the same analog signal, there is a difference of 0.1 MHz oscillation frequency between the two oscillation circuits. This difference of 0.1 MHz may cause the offset in the digital signal.

Thus, in the AD converter of the related art, there is a problem in which the digital signals output with respect to the same analog signal may be varied because of the manufacturing variations of the oscillation circuits or the offset caused by the difference of the oscillation frequency between the two oscillation circuits.

DETAILED DESCRIPTION

Embodiments will now be explained with reference to the accompanying drawings. The present invention is not limited to the embodiments.

In one embodiment, an AD converter includes a first oscillation circuit, a first counter, a first arithmetic circuit, a second oscillation circuit, a second counter, a second arithmetic circuit, a first subtracting circuit, an adder circuit, a second subtracting circuit, and a feedback circuit.

The first oscillation circuit generates a first pulse signal having a frequency corresponding to a level of a first analog signal. The first counter counts the first pulse signal generated by the first oscillation circuit. The first arithmetic circuit generates a first signal corresponding to a change amount of a count value of the first counter at a first predetermined time interval.

The second oscillation circuit generates a second pulse signal having a frequency corresponding to a level of a second analog signal. The second counter counts the second pulse signal generated by the second oscillation circuit. The second arithmetic circuit, generates a second signal corresponding to a change amount of a count value of the second counter at a second predetermined time interval.

The first subtracting circuit outputs a digital signal corresponding to a difference between the first signal generated by the first arithmetic circuit and the second signal generated by the second arithmetic circuit. The adder circuit generates a sum signal of the first signal generated by the first arithmetic circuit and the second signal generated by the second arithmetic circuit. The second subtracting circuit generates a difference signal between the sum signal and a reference signal. The feedback circuit amplifies the difference signal and inputs the difference signal to the first oscillation circuit and the second oscillation circuit.

(First Embodiment)

Figure 1:
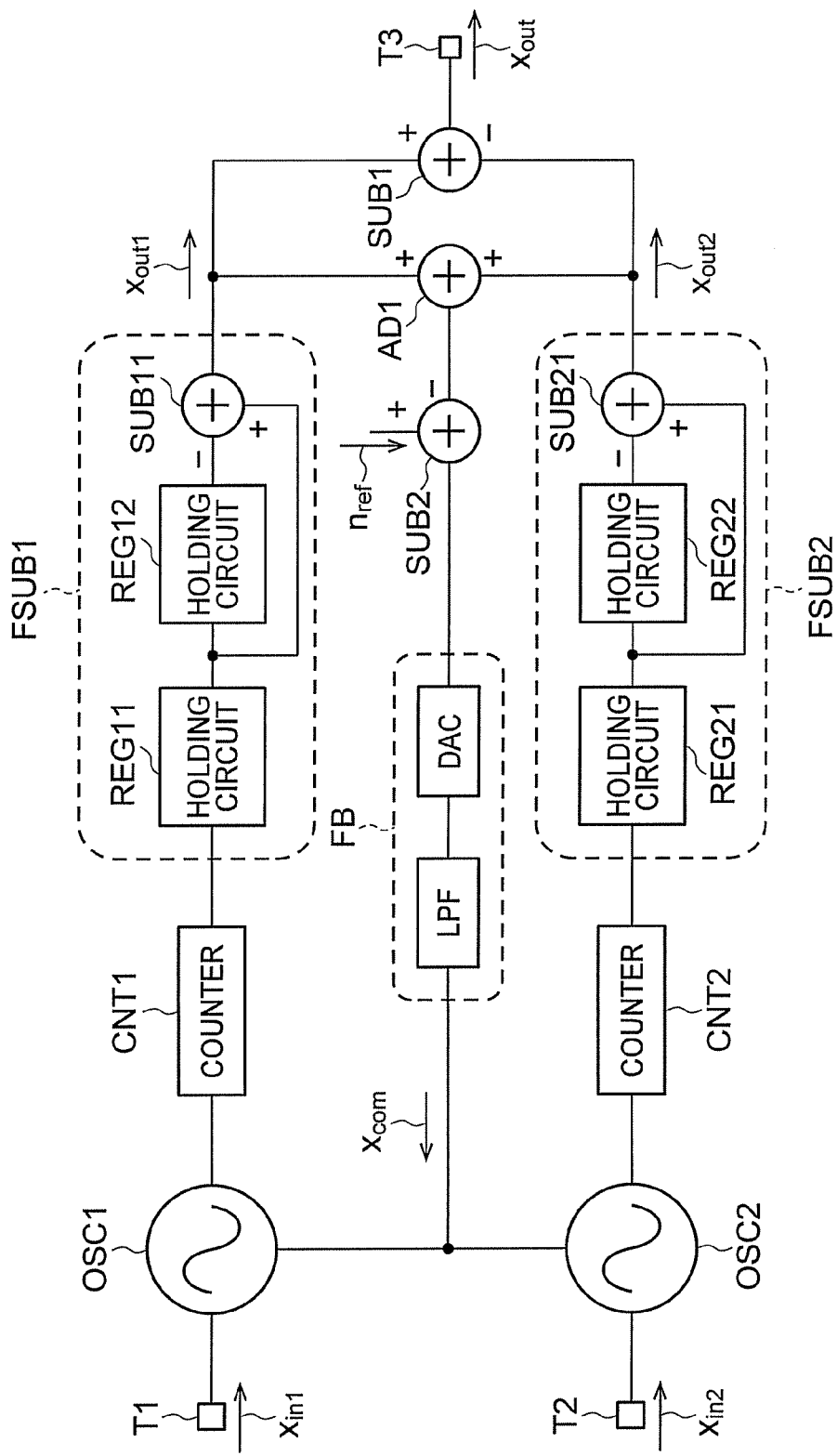
FIG. 1 is a diagram illustrating an AD converter according to a first embodiment.

A first embodiment will be described below with reference to FIGS. 1 to 4. Here, FIG. 1 is a diagram illustrating an AD converter according to the first embodiment. As illustrated in FIG. 1, the AD converter according to the present embodiment includes an oscillation circuit OSC1 (first oscillation circuit) that generates a pulse signal (first pulse signal) corresponding to a received analog signal (first analog signal), a counter CNT1 (first counter) that counts the number of the pulse signals generated by the oscillation circuit OSC1, and an arithmetic circuit FSUB1 (first arithmetic circuit) that calculates a change amount of a count value by the counter CNT1 at a predetermined time interval (first predetermined time interval).

Further, the AD converter includes an oscillation circuit OSC2 (second oscillation circuit) that generates a pulse signal (second pulse signal) corresponding to a received analog signal (second analog signal), a counter CNT2 (second counter) that counts the number of the pulse signals generated by the oscillation circuit OSC2, and an arithmetic circuit FSUB2 (second arithmetic circuit) that calculates a change amount of a count value of the counter CNT2 at a predetermined time interval(second predetermined time interval).

Furthermore, the AD converter includes a subtracting circuit SUB1 (first subtracting circuit) that calculates a difference between an output of the arithmetic circuit FSUB1 and an output of the arithmetic circuit FSUB2, an adder circuit AD1 that calculates a sum of the output of the arithmetic circuit FSUB1 and the output of the arithmetic circuit FSUB2, a subtracting circuit SUB2 (second subtracting circuit) that calculates a difference between an output of the adder circuit AD1 and a reference signal, and a feedback circuit FB that amplifies an output from the subtracting circuit SUB2 and inputs the output to the oscillation circuit OSC1 and the oscillation circuit OSC2.

The oscillation circuit OSC1 generates the pulse signal having an oscillation frequency corresponding to a level (amplitude level such as a current value and a voltage value) of the received analog signal. In other words, the oscillation circuit OSC1 has the oscillation frequency controlled by the level of the received analog signal. The oscillation circuit OSC1 receives an analog signal xin1 to be converted to a digital signal from a terminal T1, and receives a control signal xcom from the feedback circuit FB. The analog signal xin1 is a signal in which a signal component xsig is superimposed on a bias component xB. The control signal xcom is a signal generated in accordance with the outputs from the oscillation circuit OSC1 and the oscillation circuit OSC2, and executes feedback control such that the oscillation frequency of the oscillation circuit OSC1 becomes a value corresponding to a reference signal nref described below. The pulse signal output from the oscillation circuit OSC1 is received in the counter CNT1.

The counter CNT1 counts (measures) the number of the pulse signals generated by the oscillation circuit OSC1, and stores the count value. Every time the pulse signal is received from the oscillation circuit OSC1, one is added to the count value stored by the counter CNT1, thereby monotonically increasing the count value.

The arithmetic circuit FSUB1 calculates the change amount of the count value of the counter CNT1 at a sampling interval, and generates and outputs a digital signal (first signal) xout1 corresponding to the calculated change amount. The arithmetic circuit FSUB1 receives an input of a clock at the sampling interval, and the arithmetic circuit FSUB1 calculates the change amount and outputs the digital signal xout1 at the timing when the clock is received. The arithmetic circuit FSUB1 includes a holding circuit REG11 that acquires a latest count value, a holding circuit REG12 that stores a previous count value, and a subtracting circuit SUB11 that calculates a change amount of the count value.

The holding circuit REG11 acquires the latest count value from the counter CNT1 at the timing when the clock is received, and outputs a digital signal corresponding to the acquired count value. The digital signal output from the holding circuit REG11 is received in the subtracting circuit SUB11. After the digital signal xout1 is output from the subtracting circuit SUB11, the holding circuit REG11 inputs the digital signal corresponding to the acquired count value to the holding circuit REG12.

The holding circuit REG12 stores the digital signal (count value) received from the holding circuit REG11 until a next clock is received. The holding circuit REG12 inputs, to the subtracting circuit SUB11, the digital signal currently stored, i.e., the digital signal corresponding to the previous count value, at the timing when the next clock is received. After the digital signal xout1 is output from the subtracting circuit SUB11, the holding circuit REG12 receives a new digital signal from the holding circuit REG11 and stores the received digital signal until the timing when a next clock is received.

The subtracting circuit SUB11 receives the digital signal corresponding to the latest count value from the holding circuit REG11 at the timing when the clock is received, and receives the digital signal corresponding to the previous count value from the holding circuit REG12. Based on the digital signals received from the holding circuit REG11 and the holding circuit REG12, the subtracting circuit SUB11 calculates the change amount of the count value by subtracting the previous count value from the latest count value, and generates and outputs the signal xout1 corresponding to the calculated change amount of the count value. This digital signal xout1 is a digital signal obtained by digitally converting the analog signal xin1 at the sampling interval. The digital signal xout1 output from the subtracting circuit SUB11 is received in the subtracting circuit SUB1 and the adder circuit AD1.

The oscillation circuit OSC2 generates the pulse signal having the oscillation frequency corresponding to the level of the received analog signal. In other words, the oscillation frequency of the oscillation circuit OSC2 is controlled by the level of the received analog signal. The oscillation circuit OSC2 receives the analog signal xin2 to be converted to a digital signal from a terminal T2, and receives the control signal xcom from the feedback circuit FB. An analog signal xin2 is a signal in which the signal component xsig is superimposed on the bias component xB. The signal component xsig of the analog signal xin2 has polarity (phase) opposite to the signal component xsig of the analog signal Xin1. In other words, the oscillation circuit OSC1 and the oscillation circuit OSC2 differentially receive the signal component xsig. The control signal xcom is a signal generated in accordance with the outputs from the oscillation circuit OSC1 and the oscillation circuit OSC2, and executes feedback control such that the oscillation frequency at the oscillation circuit OSC2 becomes a value corresponding to the reference signal nref described later. The pulse signal output from the oscillation circuit OSC2 is received in the counter CNT2.

The counter CNT2 counts the number of the pulse signals generated by the oscillation circuit OSC2, and stores the count value. Every time the pulse signal is received from the oscillation circuit OSC2, one is added to the count value stored by the counter CNT2, thereby monotonically increasing the count value.

The arithmetic circuit FSUB2 calculates the change amount of the count value of the counter CNT2 at the sampling interval, and generates and outputs a digital signal (second signal) xout2 corresponding to the calculated change amount. The arithmetic circuit FSUB2 receives an input of a clock at the sampling interval, and the arithmetic circuit FSUB2 calculates the change amount and outputs the digital signal xout2 at the timing when the clock is received. The arithmetic circuit FSUB2 includes a holding circuit REG21 that acquires a latest count value, a holding circuit REG22 that stores a previous count value, and a subtracting circuit SUB21 that calculates a change amount of the count value.

The holding circuit REG21 acquires the latest count value from the counter CNT2 at the timing when the clock is received, and outputs the digital signal corresponding to the acquired count value. The digital signal output from the holding circuit REG21 is received in the subtracting circuit SUB21. After the digital signal xout2 is output from the subtracting circuit SUB21, the holding circuit REG21 inputs the digital signal corresponding to the acquired count value to the holding circuit REG22.

The holding circuit REG22 stores the digital signal (count value) received from the holding circuit REG21 until the next clock is received. The holding circuit REG22 inputs, to the subtracting circuit SUB21, the digital signal currently stored, i.e., the digital signal corresponding to the previous count value at the timing when the next clock is received. After the digital signal xout2 is output from the subtracting circuit SUB21, the holding circuit REG22 receives a new digital signal from the holding circuit REG21 and stores the received digital signal until the timing when the next clock is received.

The subtracting circuit SUB21 receives the digital signal corresponding to the latest count value from the holding circuit REG21 at the timing when the clock is received, and further receives the digital signal corresponding to the previous count value from the holding circuit REG22. Based on the digital signals received from the holding circuit REG21 and the holding circuit REG22, the subtracting circuit SUB21 calculates the change amount of the count value by subtracting the previous count value from the latest count value, and generates and outputs the signal xout2 corresponding to the calculated change amount of the count value. This digital signal xout2 is a digital signal obtained by digitally converting the analog signal xin2 at the sampling interval. The digital signal xout2 output from the subtracting circuit SUB21 is received in the subtracting circuit SUB1 and the adder circuit AD1.

The subtracting circuit SUB1 receives the digital signal xout1 from the arithmetic circuit FSUB1 and receives the digital signal xout2 from the arithmetic circuit FSUB2 at the sampling interval. The subtracting circuit SUB1 subtracts the digital signal xout2 from the digital signal xout1, and generates and outputs a digital signal xout which is a difference signal corresponding to a difference between the two digital signals from the terminal T3. More specifically, the subtracting circuit SUB1 calculates a difference between the change amount of the count value of the analog signal xin1 received in the oscillation circuit OSC1 and the change amount of the count value of the analog signal xin2 received in the oscillation circuit OSC2, and outputs the digital signal xout corresponding to the calculated difference of the change amount. In this manner, a level difference between the analog signal xin1 and the analog signal xin2 can be converted to a digital signal.

The adder circuit AD1 receives the digital signal xout1 from the arithmetic circuit FSUB1 and receives the digital signal xout2 from the arithmetic circuit FSUB2 at the sampling interval, in the same manner as the subtracting circuit SUB1. The adder circuit AD1 sums up the digital signal xout1 and the digital signal xout2, and outputs a digital signal, namely, a sum signal corresponding to the sum of the two digital signals. More specifically, the adder circuit AD1 calculates a sum of the change amount of the count value of the analog signal xin1 received in the oscillation circuit OSC1 and the change amount of the count value of the analog signal xin2 received in the oscillation circuit OSC2, and outputs the digital signal corresponding to the calculated sum of the change amount. The digital signal output from the adder circuit AD1 is received in the subtracting circuit SUB2.

The subtracting circuit SUB2 receives the digital signal (sum signal) corresponding to the sum of the change amount of the count value from the adder circuit AD1, and also receives the reference signal nref. The digital signal from the adder circuit AD1 is received at the sampling interval, and the reference signal nref is received at the sampling interval or as needed. The reference signal nref is a digital signal for setting the frequencies of the two oscillation circuits to a predetermined value when the analog signal is zero. More specifically, the reference signal nref is received in order to set the number of counts (oscillation frequency) corresponding to the bias component xB contained in each of the received analog signals xin1 and xin2 to the predetermined value. In this manner, the digital signals xout1 and xout2 output from the arithmetic circuit FSUB1 and the arithmetic circuit FSUB2 are output as the signals in which the signal component is superimposed on the bias component set by the reference signal nref. Therefore, the reference signal nref is set such that the bias component of each of the digital signals xout1 and xout2 becomes larger than the signal component. When the oscillation circuits OSC1 and OSC2 receive non-signalized analog signals xin1 and xin2, the bias components xB contained in each of the analog signals is digitally converted, and the bias component set by the reference signal nref is output.

The subtracting circuit SUB2 subtracts the digital signal of the adder circuit AD1 from the reference signal nref, and generates and outputs a digital signal, namely, the difference signal corresponding to the difference between the two digital signals. The digital signal output from the subtracting circuit SUB2 is received in the feedback circuit FB.

The feedback circuit FB converts the digital signal (difference signal) received from the subtracting circuit SUB2 to an analog signal, and amplifies the analog signal by a predetermined gain to input to the oscillation circuit OSC1 and the oscillation circuit OSC2. The feedback circuit FB includes a DA converter DAC that converts a digital signal to an analog signal, and a filter LPF that amplifies a received signal.

The DA converter DAC converts the digital signal received from the subtracting circuit SUB2 to the analog signal. The DA converter DAC may be optional from a pulse modulation D/A converter, a delta sigma DA converter, and so on. The analog signal output from the DA converter DAC is received in the filter LPF.

The filter LPF is a lowpass filter (low-frequency pass filter) that amplifies and passes frequency components lower than a cutoff frequency by the predetermined gain and reduces and removes frequency components higher than the cutoff frequency. The filter LPF removes high-frequency components (frequency components having the frequency higher than the cutoff frequency) from the analog signal received from the DA converter, and generates the control signal xcom by amplifying low-frequency components (frequency components having the frequency lower than the cutoff frequency) by the predetermined gain.

The control signal xcom is a signal for executing the feedback control such that the oscillation frequencies become a predetermined frequency when the analog signals at the oscillation circuit OSC1 and the oscillation circuit OSC2 are zero, and is the signal to be received in the oscillation circuit OSC1 and the oscillation circuit OSC2. Also, the control signal xcom executes the feedback control for the oscillation frequency of the oscillation circuit OSC1 so as to remove fluctuation of the bias component xB contained in the analog signal xin1 (xin2) from the digital signal xout1 (xout2). To remove the fluctuation of the bias component xB, the cutoff frequency of the filter LPF is set such that a frequency of a fluctuation component of the bias component xB is contained in a passband (low-frequency components).

Meanwhile, according to the present embodiment, the DA converter DAC is disposed between the subtracting circuit SUB2 and the filter LPF, but may be disposed between the filter LPF and the oscillation circuit. In this case, the digital signal output from the subtracting circuit SUB2 is first amplified by the filter LPF first and also the high-frequency components are removed. Next, the digital signal output from the filter LPF is converted to the analog signal by the DA converter DAC and received in the oscillation circuit OSC1 and the oscillation circuit OSC2 as the control signal xcom Further, it is also possible that the feedback circuit FB does not include the DA converter DAC, but the oscillation circuit OSC1 and the oscillation circuit OSC2 is provided with a function of analog conversion. In this case, the digital signal output from the subtracting circuit SUB2 is first amplified by the filter LPF and also the high-frequency components are removed. Next, the digital signal output from the filter LPF is received in the oscillation circuit OSC1 (OSC2) and converted to the analog signal inside the oscillation circuit OSC1 (OSC2), and controls the oscillation frequency of the oscillation circuit OSC1 (OSC2) as the control signal xcom.

Next, operation of the AD converter according to the present invention will be described. In the following, values of respective signals x and n are indicated by attaching same index to uppercase letters X and N, same as the signals x and n. The value of each signal represents the oscillation frequency corresponding to the signal. For instance, Xin1 represents the oscillation frequency corresponding to the signal xin1. The value of each signal may also be the level or the count value of each signal instead of the oscillation frequency. Additionally, in the following description, a conversion coefficient from the signal xin1 (xin2) converted to the digital signal xout1 is defined as Ks, a conversion coefficient from the signal xcom converted to the digital signal xout1 is defined as Kc, and the gain at the filter LPF is defined as A.

The signals xin1 and xin2 to be received in the oscillation circuit OSC1 and the oscillation circuit OSC2 are the signals in which the signal components xsig are superimposed on the bias components xB, and the signal components xsig having the opposite polarity (phases) are differentially received. Therefore, following formulas are established.

$$X\text{in}1 = XB + X\text{sig} \tag{1}$$

$$X\text{in}2 = XB - X\text{sig} \tag{2}$$

When the signal xin1 (xin2) and the control signal xcom are received in the oscillation circuit OSC1 (OSC2), the respective signals are converted with the conversion coefficient Ks and the conversion coefficient Kc, and the signal xout1 (xout2) on which the converted signals are superimposed is output. Also, the control signal xcom is the signal obtained by subtracting the sum of the signals xout1 and xout2 from the reference signal nref and applying amplification with the gain A. Therefore, following formulas are established.

$$X\text{out}1 = KsX\text{in}1 + KcX\text{com} \tag{3}$$

$$X\text{out}2 = KsX\text{in}2 + KcX\text{com} \tag{4}$$

$$X\text{com} = A\{N\text{ref} - (X\text{out}1 + X\text{out}2)\} \tag{5}$$

According to the formulas (3), (4), and (5), Xout1 and Xout2 can be calculated as follows.

$$X\text{out}1 = \{AKcN\text{ref} + (1+AKc)KsX\text{in}1 - AKcKsX\text{in}2\}/(1+2AKc) \tag{4}$$

$$X\text{out}2 = \{AKcN\text{ref} + (1+AKc)KsX\text{in}2 - AKcKsX\text{in}1\}/(1+2Akc) \tag{5}$$

In the case of plugging the formulas (1) and (2) into the above formulas (4) and (5), Xout1 and Xout2 can be calculated as follows.

$$X\text{out}1 = \{(1+2AKc)KsX\text{sig} + AKcN\text{ref} + KsXB\}/(1+2AKc) \tag{6}$$

$$X\text{out}2 = \{-(1+2AKc)KsX\text{sig} + AKcN\text{ref} + KsXB\}/(1+2AKc) \tag{7}$$

Here, in the case of setting the gain A of the filter LPF large (A>>1), the formulas (6) and (7) can be approximated as follows.

$$X\text{out}1 \approx KsX\text{sig} + N\text{ref}/2 \tag{8}$$

$$X\text{out}2 \approx -KsX\text{sig} + N\text{ref}/2 \tag{9}$$

In other words, the signal xout1 and signal xout2 are output as the digital signals in which the signal component is superimposed on a predetermined bias component set by the reference signal nref.

The signal xout output from the terminal T3 is a signal obtained by subtracting the signal xout2 from the signal xout1. Therefore, a following formula is established according to the formulas (8) and (9)

$$X\text{out} = X\text{out}1 - X\text{out}2 \approx 2KsX\text{sig} \tag{10}$$

Thus, when the analog signals xin1 and xin2 containing the signal component xsig are differentially received in the AD converter according to the present embodiment, the digital signal xout having the oscillation frequency 2KsXsig corresponding to the oscillation frequency Xsig of the signal component xsig is output. In this manner, the signal component xsig of the analog signals xin1 and xin2 can be converted to the digital signal.

As described above, according to the present embodiment, the digital signals xout1 and xout2 in which the signal component is superimposed on the predetermined bias component set by the reference signal nref can be output. In other words, the bias components of the digital signals xout1 and xout2 can be set without depending on bias components xB of the input signals xin1 and xin2. Therefore, even in the case where manufacturing variations are generated in the two oscillation circuits, the gain of frequency conversion can be set at the predetermined value by the reference signal nref. In this manner, performance variation of the AD converter can be suppressed. Further, resolution of the AD converter can be easily controlled by controlling the value of the reference signal nref.

Note that, according to the present embodiment, it is also possible to control the conversion coefficient Ks from the input signal xin1 (xin2) converted to the digital signal xout1 (xout2) in accordance with the value of the control signal xcom (Ks=BXcom). In this manner also, the digital signals xout1 and xout2 in which the signal component is superimposed on the predetermined bias component set by the reference signal nref can be output, same as above.

Figure 2:
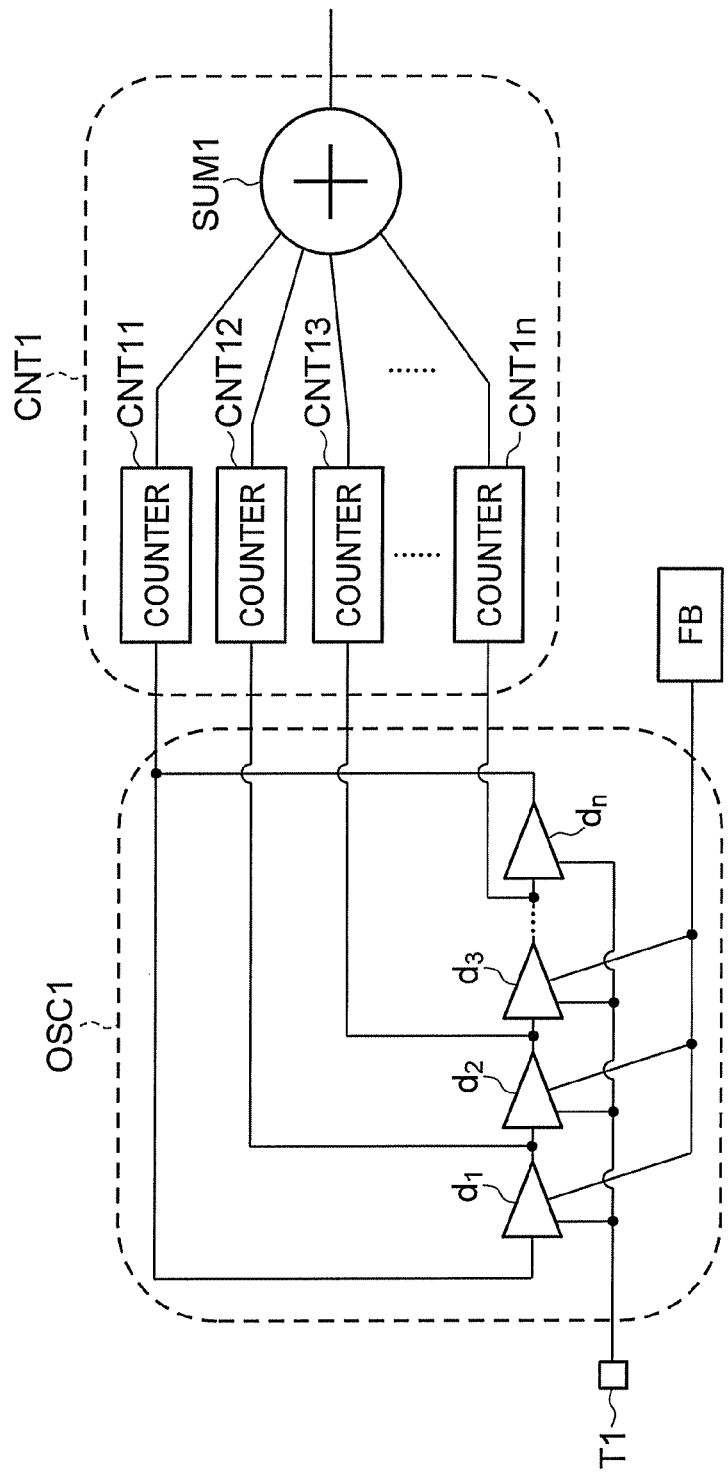
FIG. 2 is a diagram illustrating an example of an oscillation circuit and a counter in FIG. 1.

Additionally, at least one of the oscillation circuit OSC1 and the oscillation circuit OSC2 may be a ring oscillation circuit. FIG. 2 is a diagram illustrating an example of the oscillation circuit OSC1 including the ring oscillation circuit and the counter CNT1. As illustrated in FIG. 2, the oscillation circuit OSC1 includes a plurality of delay elements di (i=1 to n) arranged in a ring shape. Each of the delay elements di is connected to the terminal T1 and the feedback circuit FB, and the input signal xin1 and the control signal xcom are received by each of the delay elements di. Each of the delay elements di outputs a pulse signal corresponding to the level of the received analog signal, delaying the output timing by a predetermined time.

Figure 3:
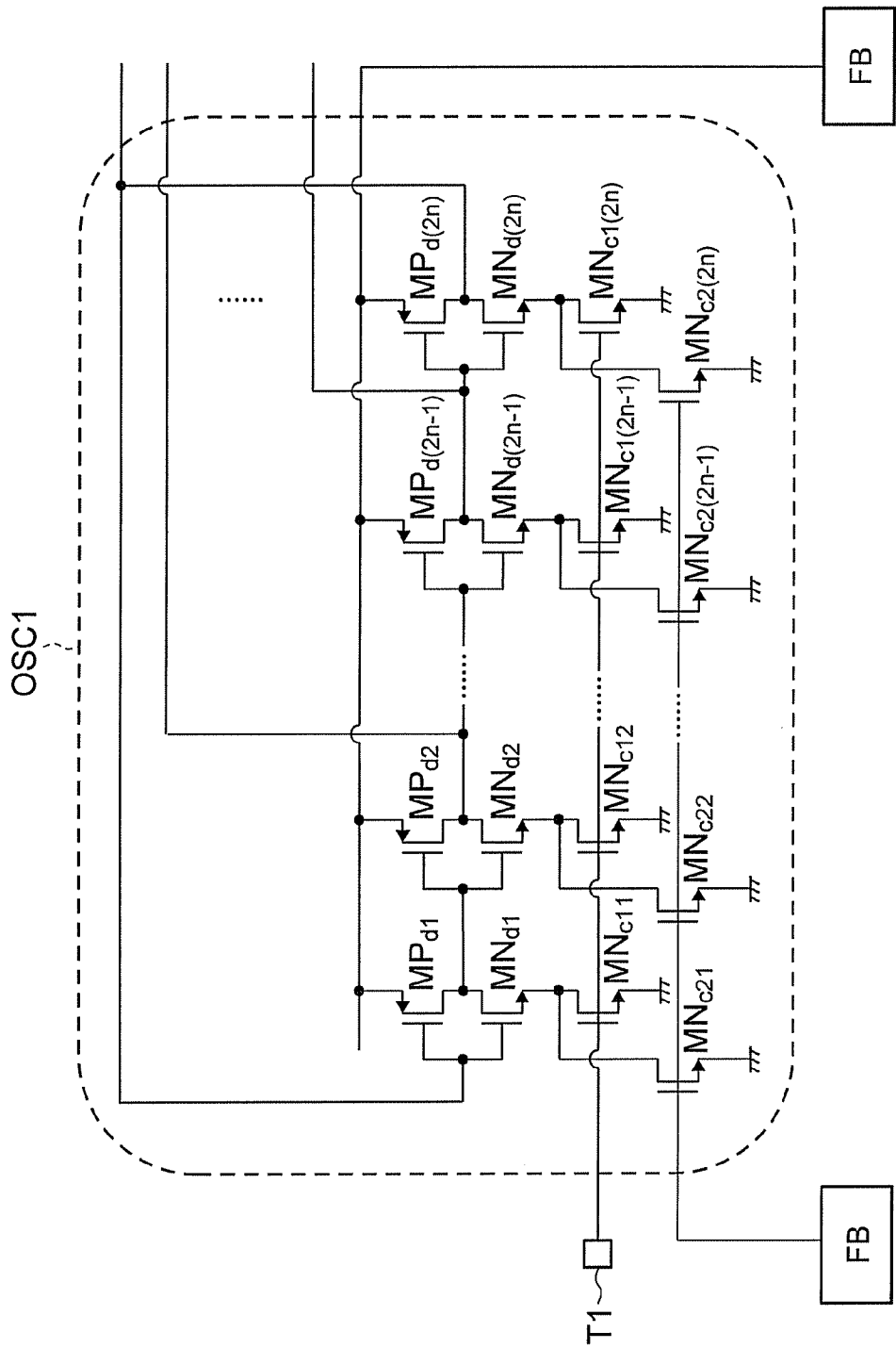
FIG. 3 is a diagram illustrating an example of a circuit configuration of the oscillation circuit in FIG. 2.

The delay element di can be configured by connecting with two inverter circuits as illustrated in FIG. 3. The oscillation circuit OSC1 thus configured receives the control signal xcom as power supply voltage for the inverter circuits formed by transistors MPdi (i=1 to 2n) and MNdi (i=1 to 2n). Otherwise, the control signal xcom is received as gate voltage at transistors MNc2i (i=1 to 2n). With this configuration, the oscillation frequency of the oscillation circuit OSC1 can be controlled such that the digital signals xout1 and xout2 become the digital signals in which the signal component is superimposed on the predetermined bias component set by the reference signal nref.

Further, in the case where the digital signal is received from the filter LPF, in other words, in the case where the feedback circuit FB does not include the DA converter DAC, the transistor MNc2i may include a plurality of transistors. The received digital signal can be converted to the analog signal by changing the number of transistors used in accordance with the digital signal received from the filter LPF.

In the case where the oscillation circuit OSC1 is the ring oscillation circuit, the counter CNT1 includes a plurality of counters CNT11 to CNT1n that counts each of the pulse signals output from each of the delay elements di, and an adder circuit SUM1 that sums the respective count values of the plurality of counters CNT11 to CNT1n. The arithmetic circuit FSUB1 executes digital conversion using the count value summed by the adder circuit SUM1. With this configuration, the oscillation frequency of the oscillation circuit OSC1 can be easily increased and the resolution of the AD converter can be improved.

Figure 4:
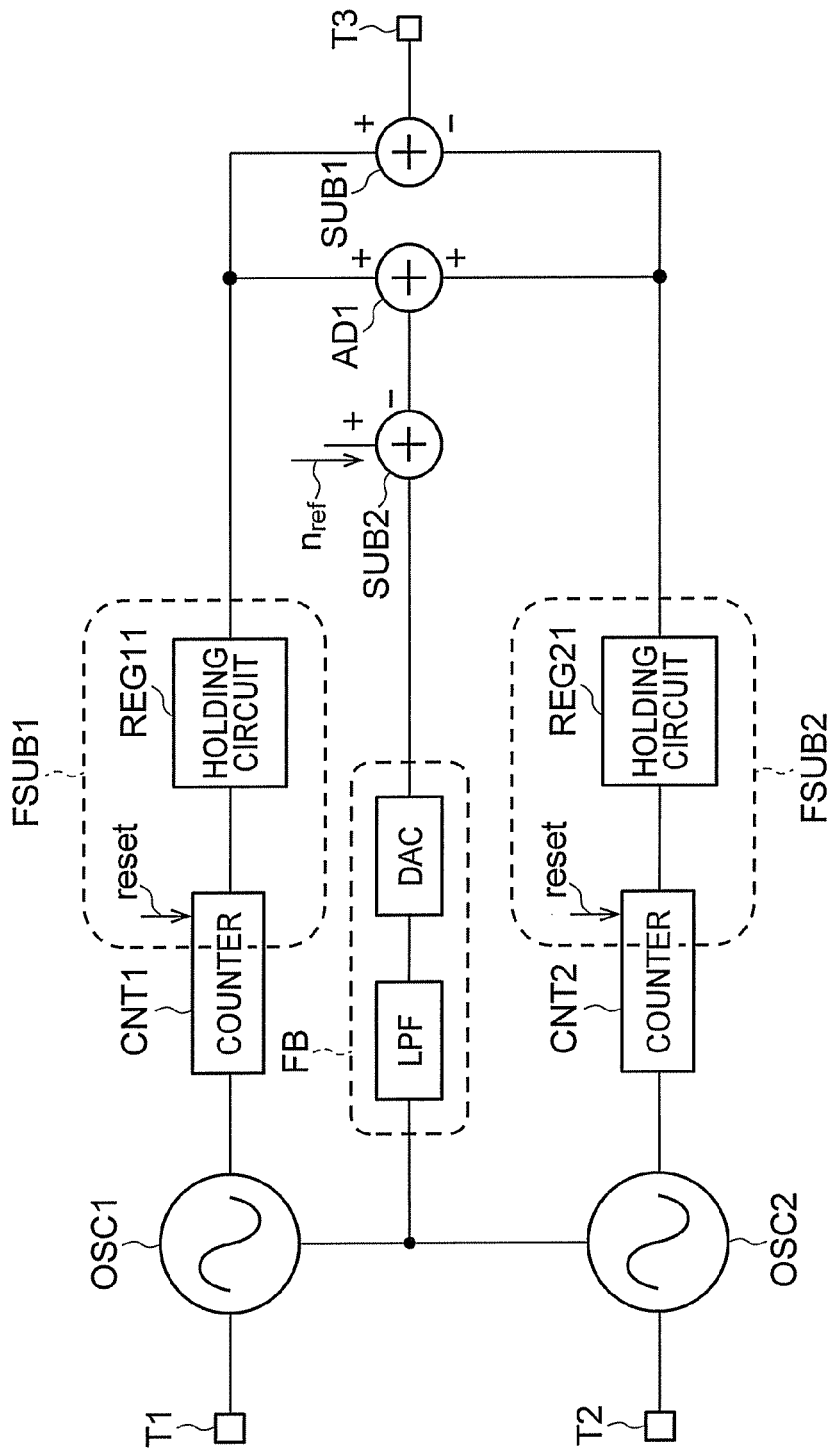
FIG. 4 is a diagram illustrating a modified example of the AD converter according to the first embodiment.

Additionally, it is also possible to configure the counter CNT1 (CNT2) so as to reset the count value. In this case, as illustrated in FIG. 4, the arithmetic circuit FSUB1 (FSUB2) does not include the holding circuit REG12 (REG22) and the subtracting circuit SUB11 (SUB21), and the count value is reset in synchronizing with timing when the holding circuit REG11 (REG21) acquires the latest count value. In this manner, the latest count value acquired by the holding circuit REG11 (REG21) becomes the count value of a unit period of the sampling period, and the digital signal output from the holding circuit REG11 (REG21) corresponding to this count value becomes same as the digital signal xout1 (xout2) output from the subtracting circuit SUB11 (SUB21) in FIG. 1.

(Second Embodiment)

Figure 5:
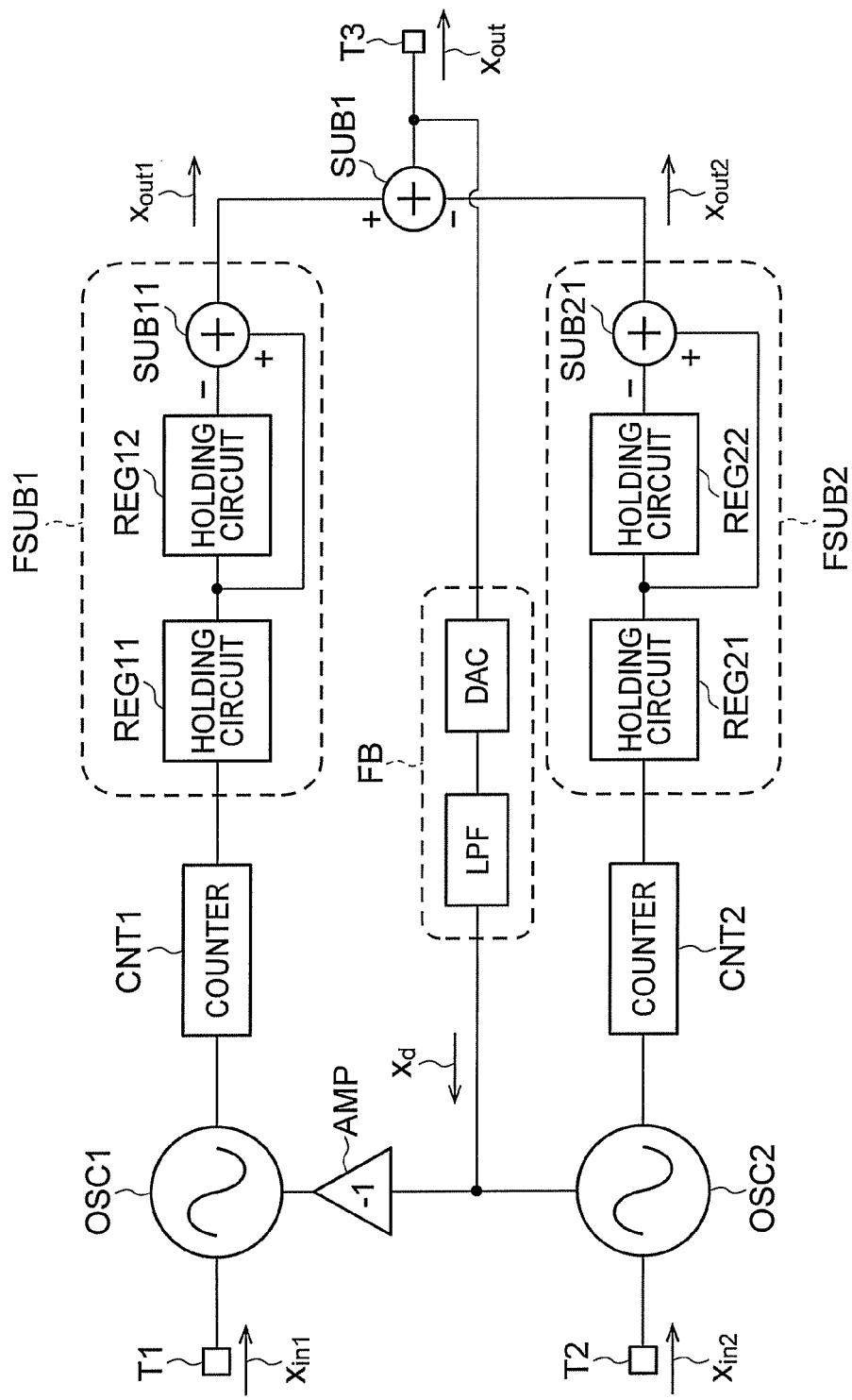
FIG. 5 is a diagram illustrating an AD converter according to a second embodiment.

Next, a second embodiment will be described with reference to FIGS. 5 and 6. According to the present embodiment, an AD converter operates so as to remove an offset component xoffset contained in an output signal xout. Here, FIG. 5 is a diagram illustrating the AD converter according to the second embodiment. As illustrated in FIG. 5, the AD converter according to the present embodiment includes an oscillation circuit OSC1 (first oscillation circuit) that generates a pulse signal (first pulse signal) corresponding to a received analog signal (first analog signal), a counter CNT1 (first counter) that counts the number of the pulse signals generated by the oscillation circuit OSC1, and an arithmetic circuit FSUB1 (first arithmetic circuit) that calculates a change amount of a count value of the counter CNT1 at a predetermined time interval (first predetermined time interval).

Further, the AD converter includes an oscillation circuit OSC2 (second oscillation circuit) that generates a pulse signal (second pulse signal) corresponding to a received analog signal (second analog signal), a counter CNT2 (second counter) that counts the number of the pulse signals generated by the oscillation circuit OSC2, and an arithmetic circuit FSUB2 (second arithmetic circuit) that calculates a change amount of a count value of the counter CNT2 at a predetermined time interval (second predetermined time interval). The configurations of the above components are same as the first embodiment, and therefore, the description therefor will be omitted.

According to the present embodiment, the AD converter further includes a subtracting circuit SUB1 that calculates a difference between an output of the arithmetic circuit FSUB1 and an output of the arithmetic circuit FSUB2, a feedback circuit FB that amplifies an output from the subtracting circuit SUB1 and inputs the output to the oscillation circuit OSC1 and the oscillation circuit OSC2, and an inverting circuit AMP that inverts polarity of the output received in the oscillation circuit OSC1 from the feedback circuit FB.

The subtracting circuit SUB1 receives the digital signal xout1 from the arithmetic circuit FSUB1 and receives the digital signal xout2 from the arithmetic circuit FSUB2 at the sampling interval. The subtracting circuit SUB1 subtracts the digital signal xout2 from the digital signal xout1 and outputs the digital signal xout corresponding to a difference between the two digital signals from the terminal T3. In other words, the subtracting circuit SUB1 calculates a difference between the change amount of the count value of the analog signal xin1 received in the oscillation circuit OSC1 and the change amount of the count value of the analog signal xin2 received in the oscillation circuit OSC2, and outputs the digital signal xout corresponding to the calculated difference of the change amount. In this manner a level difference between the analog signal xin1 and the analog signal xin2 can be converted to a digital signal. Further, the digital signal xout output from the subtracting circuit SUB1 is received in the feedback circuit FB.

The feedback circuit FB converts the digital signal xout received from the subtracting circuit SUB1 to an analog signal, amplifies the analog signal by a predetermined gain to input to the oscillation circuit OSC1 and the oscillation circuit OSC2. The feedback circuit FB includes a DA converter DAC that converts the digital signal to the analog signal, and a filter LPF that amplifies the received signal. Here, the configuration of the DA converter DAC is same as the first embodiment, and therefore the description will be omitted.

The filter LPF is a lowpass filter (low-frequency pass filter) that amplifies and passes frequency components lower than a cutoff frequency by the predetermined gain, and reduces and removes frequency components higher than the cutoff frequency for removal. The filter LPF removes high-frequency components (frequency components having the frequency higher than the cutoff frequency) from the analog signal received from the DA converter, and generates a control signal xd by amplifying low-frequency components (frequency components having the frequency lower than the cutoff frequency) by the predetermined gain.

The control signal xd controls oscillation frequencies of the oscillation circuit OSC1 and oscillation circuit OSC2 so as to correct the offset component xoffset caused by a difference of oscillation frequency between the two oscillation circuits. In other words, the control signal xd executes the control such that the oscillation frequency tending to be relatively high in the oscillation circuit is lowered and the oscillation frequency tending to be relatively low in the oscillation circuit is raised. The control signal xd is received in the oscillation circuit OSC1 via the inverting circuit AMP while the signal xd is directly received in the oscillation circuit OSC2.

The above offset component xoffset is contained in the output signal xout as a direct current (DC) component. Therefore, the filter LPF having the large gain for the DC component is preferable so as to feed back the DC component of the signal xout as the control signal xd. Also, the filter LPF having a narrow passband (low cutoff frequency) is preferable so as not to feed back the signal component contained in the output signal xout as the control signal xd. An integrating circuit may be used as the filter LPF, for example.

The inverting circuit AMP inverts the polarity (phase) of the control signal xd output from the feedback circuit FB and inputs the control signal to the oscillation circuit OSC1. An inverting amplifier circuit having unity gain may be used as the inverting circuit AMP, for example.

Next, the operation of the AD converter according to the present embodiment will be described. In the following description, a conversion coefficient from the signal xin1 (xin2) converted to the digital signal xout1(xout2) is defined as Ks, a conversion coefficient form the control signal xd to the digital signal xout1(xout2) is defined as Kc, the offset component contained in the output signal xout is defined as xoffset, and the gain at the filter LPF is defined as A(ω).

The signals xin1 and xin2 to be received in the oscillation circuit OSC1 and the oscillation circuit OSC2 are the signals in which the signal components xsig are superimposed on the bias components xB, and the signal components xsig having the opposite polarity (phases) are differentially received. Therefore, following formulas are established.

$$Xin1 = XB + Xsig \quad (11)$$

$$Xin2 = XB - Xsig \quad (12)$$

When the xin1 (xin2) and the control signal xd are received in the oscillation circuit OSC1 (OSC2), the respective signals are converted by the conversion coefficient Ks and the conversion coefficient Kc, and the xout1 (xout2) in which the converted signals are superimposed is output. Further, the control signal xd is received in the oscillation circuit OSC1 with its polarity inverted. Additionally, the offset component xoffset is contained in the output signal xout. Therefore, following formulas are established.

$$Xout1 = KsXin1 - KcXd \quad (13)$$

$$Xout2 = KsXin2 + KcXd + Xoffset \quad (14)$$

$$Xd = A(\omega)Xout = A(\omega)(Xout1 - Xout2) \quad (15)$$

According to the above formulas (13), (14), and (15), Xout can be calculated as follows.

$$Xout = \{Ks(Xin1 - Xin2) - Xoffset\}/(1 + 2A(\omega)Kc) \quad (16)$$

In the case of plugging the formulas (11) and (12) into the above formula (16), Xout can be calculated as follows.

$$Xout = (-Xoffset + 2KsXsig)(1 + 2A(\omega)Kc) \quad (17)$$

Here, in the case of setting the gain A(ω) of the filter LPF large (A(0)>>1) in the vicinity of the DC (ω≈0), the formula (17) can be approximated as follows.

$$Xout \approx 0 \quad (18)$$

Also, in the case of setting the gain A(ω) small (A(ω)<<1) in the frequency band other than the vicinity of the DC, the formula (17) can be approximated as follows.

$$Xout \approx 2KsXsig \quad (19)$$

In other words, the output signal xout does not contain the DC component (offset component xoffset), and other frequency region includes the digital signal corresponding to the oscillation frequency of the signal component xsig.

As described above, according to the present embodiment, even in the case where frequency offset is generated between the two oscillation circuits, the output signal xout for which the offset component xoffset is suppressed can be output. In this manner, performance variation of the AD converter can be suppressed.

Figure 6:
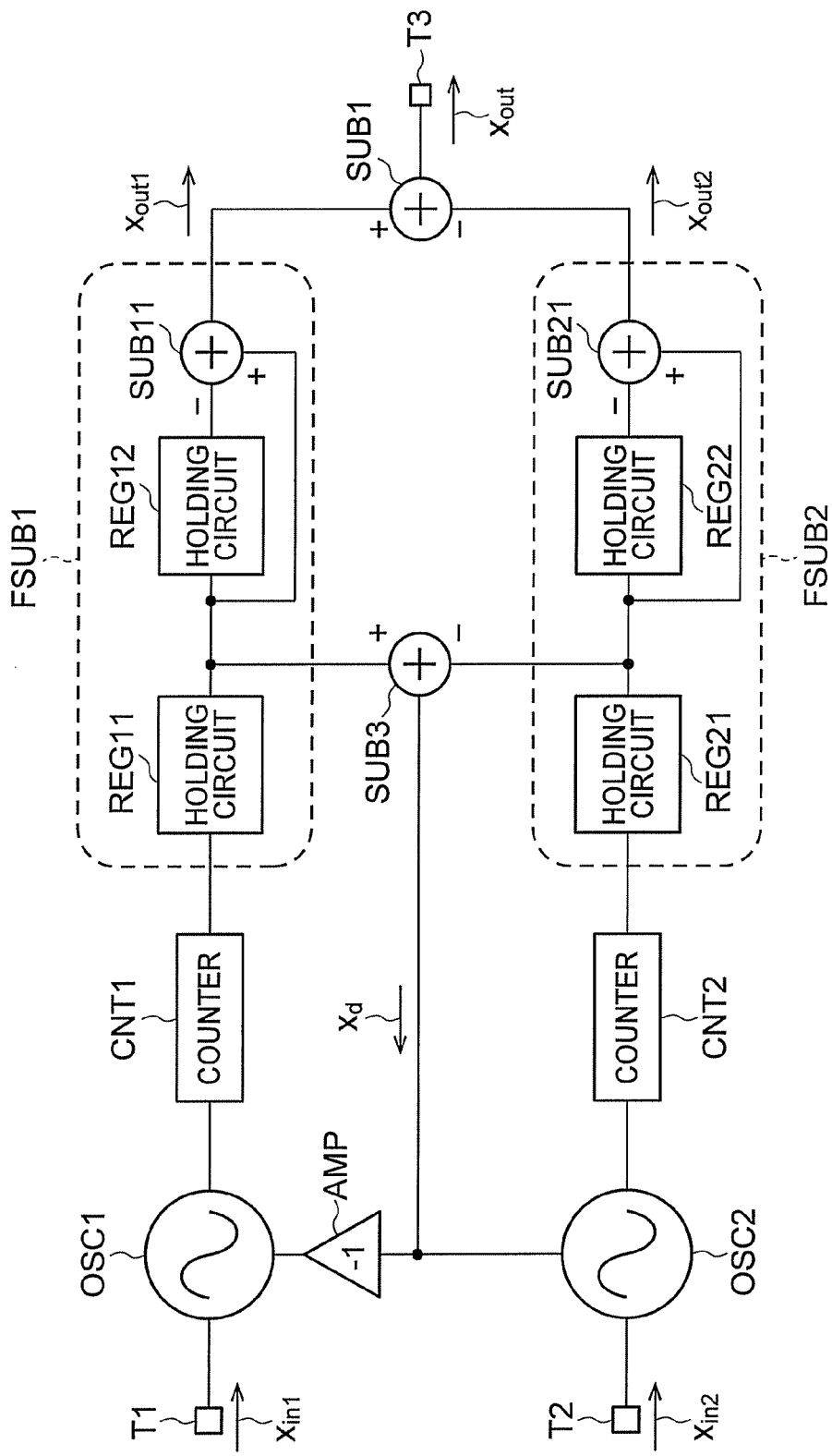
FIG. 6 is a diagram illustrating a modified example of the AD converter according to the second embodiment.

FIG. 6 is a diagram illustrating a modified example of the present embodiment. According to this modified example, the AD converter includes a subtracting circuit SUB3 instead of the feedback circuit FB. The subtracting circuit SUB3 receives a digital signal corresponding to a latest count value of the counter CNT1 from the holding circuit REG11 at the sampling interval and also receives a digital signal corresponding to a latest count value of the counter CNT2 from the holding circuit REG21. The subtracting circuit SUB3 subtracts the digital signal received from the holding circuit REG21 from the digital signal received from the holding circuit REG11, and outputs the control signal xd corresponding to a difference between the two digital signals. The control signal xd is received in the oscillation circuit OSC1 via the inverting circuit AMP while the control signal xd is directly received in the oscillation circuit OSC2.

The processing of calculating the difference between the count values by the arithmetic circuit FSUB1 (FSUB2) at the sampling interval in FIG. 5 may be deemed as differential processing. Further, removal of the high-frequency component by the filter LPF may be deemed as integration processing. Therefore, in FIG. 5, the processing executed by the arithmetic circuit FSUB1 (FSUB2), subtracting circuit SUB1, and filter LPF is substantially equivalent to the processing of calculating the difference between the count value of the counter CNT1 and the count value of the counter CNT2. Accordingly, the same effect as the AD converter in FIG. 5 can be obtained in this modified example as well. In other words, even in the case where a difference is generated in the gain of the frequency conversion between the two oscillation circuits, the output signal xout for which the offset component xoffset is suppressed can be output.

(Third Embodiment)

Figure 7:
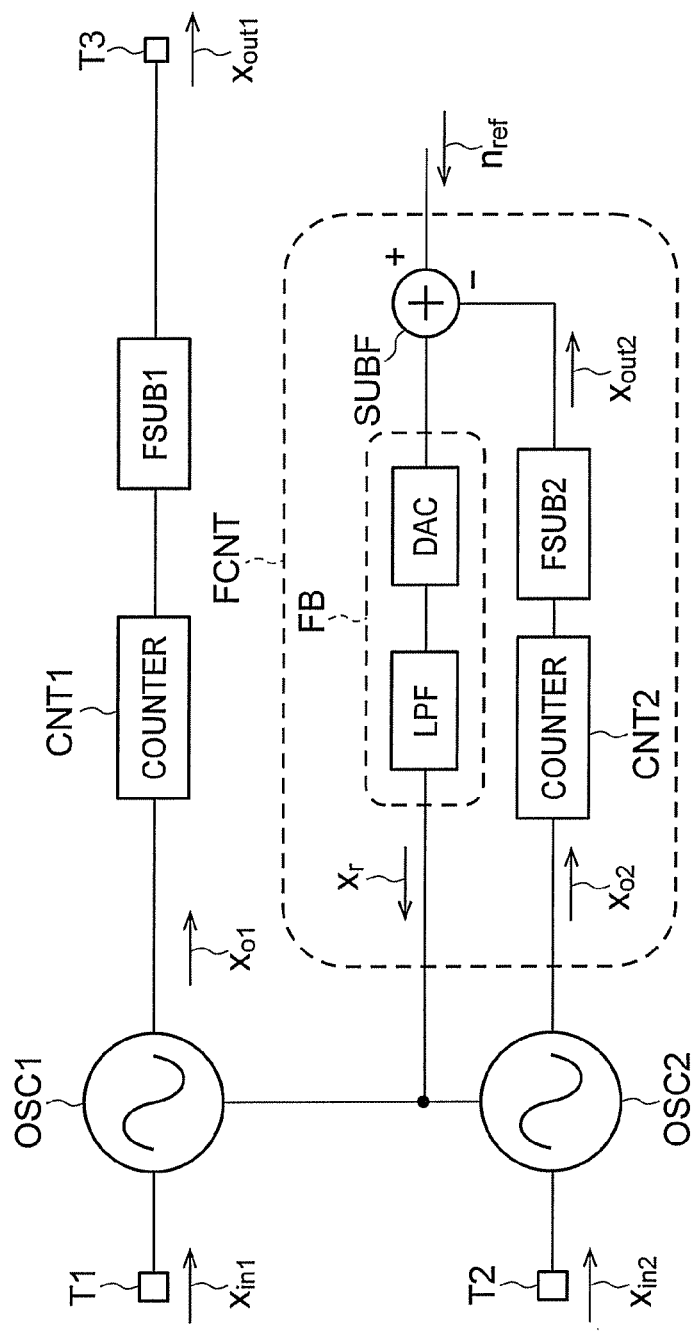
FIG. 7 is a diagram illustrating an AD converter according to a third embodiment.

Next, a third embodiment will be described with reference to FIG. 7. According to the present embodiment, an AD converter operates so as to output a digital signal xout1 in which a signal component is superimposed on a predetermined bias component set by a reference signal nref. Here, FIG. 7 is a diagram illustrating the AD converter according to the third embodiment. As illustrated in FIG. 7, the AD converter according to the present embodiment includes an oscillation circuit OSC1 (first oscillation circuit) that generates a pulse signal (first pulse signal) xo1 corresponding to a received analog signal (first analog signal), a counter CNT1 that counts the number of pulse signals generated by the oscillation circuit OSC1, an arithmetic circuit FSUB1 (first arithmetic circuit) that calculates a change amount of a count value of the counter CNT1 at a predetermined time interval (first predetermined time interval), an oscillation circuit OSC2 (second oscillation circuit) that generates a pulse signal (second pulse signal) xo2 corresponding to a received analog signal (second analog signal), a counter CNT2 that counts the number of pulse signals generated by the oscillation circuit OSC2, and an arithmetic circuit FSUB2 (second arithmetic circuit) that calculates a change amount of a count value of the counter CNT2 at a predetermined time interval (second predetermined time interval). According to the present embodiment, a digital signal (first digital signal) xout1 output from the arithmetic circuit FSUB1 is equivalent to an output signal xout according to the first embodiment.

The configurations of the above components are same as the first embodiment, and therefore, the description therefor will be omitted.

Further, according to the present embodiment, the AD converter includes a control circuit FCNT that compares a digital signal (second digital signal) xout2 corresponding to the output signal xo2 of the oscillation circuit OSC2 with a reference signal nref, and generates and outputs an analog signal based on a comparison result. The control circuit FCNT includes the counter CNT2, the arithmetic circuit FSUB2 that outputs the digital signal xout2 corresponding to the output signal xo2 of the oscillation circuit OSC2, a subtracting circuit SUBF that calculates a difference between the reference signal nref and the digital signal xout2, a DA converter DAC that converts the digital signal received from the subtracting circuit SUBF to an analog signal, and a filter LPF (filter unit) that amplifies the analog signal by a predetermined gain.

The subtracting circuit SUBF receives the digital signal xout2 from the arithmetic circuit FSUB2 and also receives the reference signal nref. The digital signal xout2 and the reference signal nref are received at a sampling interval. The subtracting circuit SUBF subtracts a value Xo2 corresponding to the digital signal xout2 from a value Nref corresponding to the reference signal ref, and generates and outputs a digital signal, namely, a difference signal corresponding to a difference between the two signals. The digital signal output from the subtracting circuit SUBF is converted to the analog signal by the DA converter DAC and received in the filter LPF.

The filter LPF has the same configuration as the filter LPF according to the first embodiment, and amplifies the analog signal received from the subtracting circuit SUBF by a predetermined gain, and generates a control signal xr by removing high-frequency components. The control signal xr is received by the oscillation circuit OSC1 (OSC2).

Next, the operation of the AD converter according to the present embodiment will be described. In the following description, a conversion coefficient when an input signal xin11 (xin2) is converted to the pulse signal xo1 (xo2) is defined as Ks1, a conversion coefficient when the control signal xr is converted to the pulse signal xo1 (xo2) is defined as Kc1, a conversion coefficient when the pulse signal xo1 (xo2) is converted to the output signal xout1 (xout2) is defined as Ks2, and the gain of the filter LPF is defined as A.

The signals xin1 and xin2 to be received in the oscillation circuit OSC1 and the oscillation circuit OSC2 are the signals in which the signal components xsig are superimposed on the bias components xB, and the signal components xsig having the opposite polarity (phases) are differentially received. Therefore, following formulas are established.

$$Xin1 = XB + Xsig \quad (20)$$

$$Xin2 = XB - Xsig \quad (21)$$

When the signal xin1 (xin2) and the control signal xr are received in the oscillation circuit OSC1 (OSC2), the respective signals are converted by the conversion coefficient Ks1 and conversion coefficient Kc1, and the pulse signal xo1 (xo2) on which the converted signals are superimposed is output. Also, the control signal xr is a signal obtained by subtracting the output signal xout2 from the reference signal nref and executing amplification by the gain A. Further, the pulse signal xo1 (xo2) is converted to the output signal xout1 (xout2) by the conversion coefficient Ks2. Therefore, following formulas are established.

$$Xo1 = Ks1Xin1 + Kc1Xr \quad (22)$$

$$Xo2 = Ks1Xin2 + Kc1Xr \quad (23)$$

$$Xr = A(Nref - Xout2) = A(Nref - Ks2Xo2) \quad (24)$$

$$Xout1 = Ks2Xo1 \quad (25)$$

According to the formulas (23) and (24), Xr can be calculated as follows.

$$Xr = A(Nref - Ks1Ks2Xin2)/(1 + AKc1Ks2) \quad (26)$$

Here, in the case of setting the gain A of the filter LPF large (A >> 1), the formula (26) can be approximated as follows.

$$Xr \approx (Nref - Ks1Ks2Xin2)/Kc1Ks2 \quad (27)$$

In the case of plugging the formula (22) into the above formula (27), Xo1 can be calculated as follows.

$$Xo1 = (Xin1 - Xin2)Ks1 + Nref/ks2 \quad (28)$$

In the case of plugging the formulas (20) and (21) into the above formula (28), Xo1 can be calculated as follows.

$$Xo1 = 2Ks1Xsig + Nref/Ks2 \quad (29)$$

Further, in the case of plugging the formula (25) into the formula (29), Xout1 can be calculated as follows.

$$Xout1 = 2Ks1Ks2Xsig + Nref$$

In other words, the output signal xout1 is output as the digital signal in which the signal component is superimposed on a predetermined bias component set by the reference signal nref.

As described above, according to the present embodiment, even in the case where manufacturing variation is generated in the two oscillation circuits, the gain of frequency conversion can be set at the predetermined value by the reference signal nref, same as the first embodiment. In this manner, performance variation of the AD converter can be suppressed. Further, resolution of the AD converter can be easily controlled by controlling the value of the reference signal nref.

(Fourth Embodiment)

Figure 8:
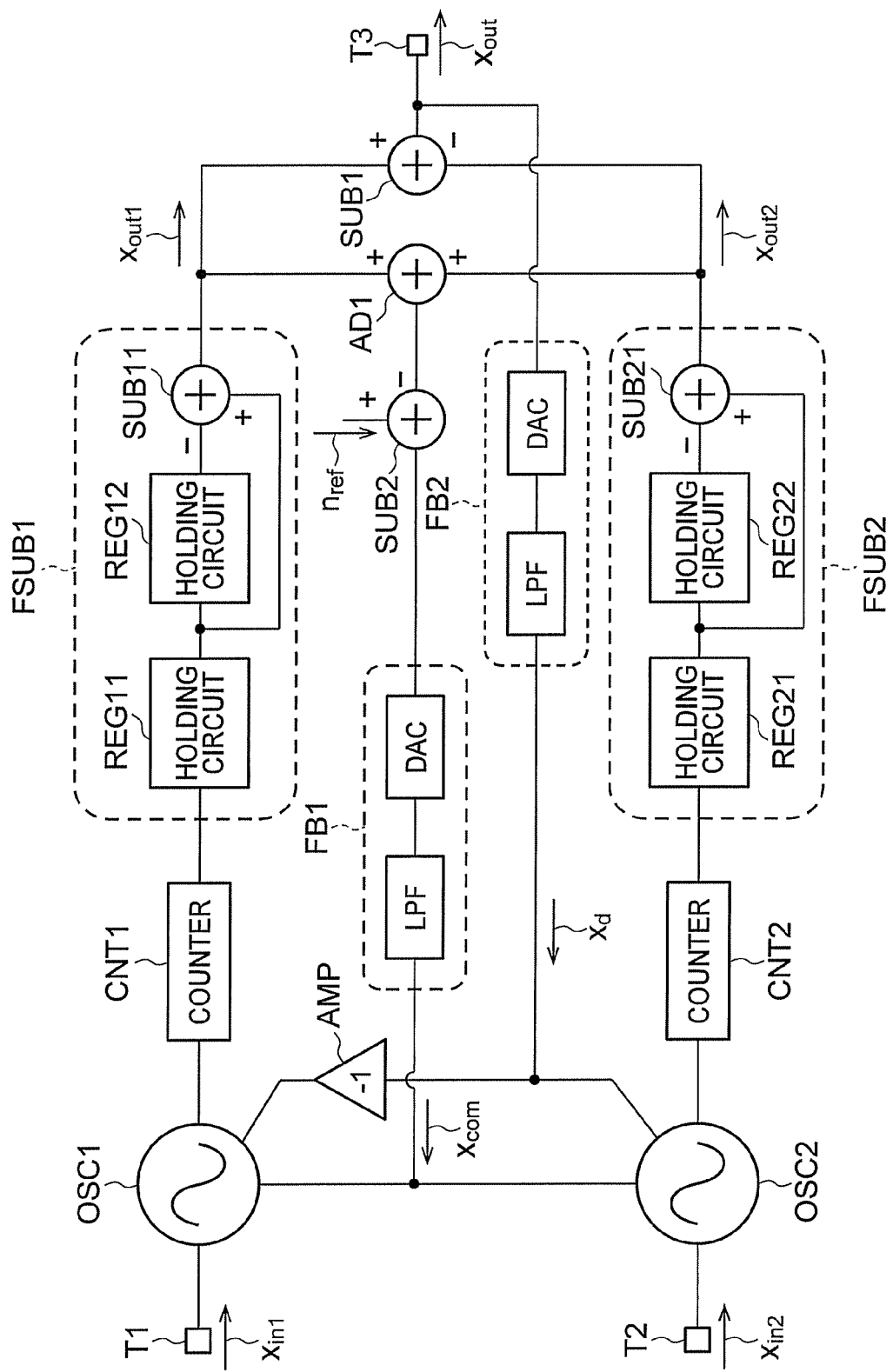
FIG. 8 is a diagram illustrating an AD converter according to a fourth embodiment.

Next, a fourth embodiment will be described with reference to FIGS. 8 to 13. An AD converter according to the present embodiment is formed by combining a configuration of the first embodiment with a configuration of the second embodiment. Here, FIG. 8 is a diagram illustrating the AD converter according to the fourth embodiment. As illustrated in FIG. 8, the AD converter according to the present embodiment includes an oscillation circuit OSC1 (first oscillation circuit) that generates a pulse signal corresponding to a received analog signal, a counter CNT1 (first counter) that counts the number of the pulse signals generated by the oscillation circuit OSC1, and an arithmetic circuit FSUB1 (first arithmetic circuit) that calculates a change amount of a count value of the counter CNT1 at a predetermined time interval.

Further, the AD converter includes an oscillation circuit OSC2 (second oscillation circuit) that generates a pulse signal corresponding to a received analog signal, a counter CNT2 (second counter) that counts the number of the pulse signals generated by the oscillation circuit OSC2, and an arithmetic circuit FSUB2 (second arithmetic circuit) that calculates a change amount of a count value of the counter CNT2 at a predetermined time interval.

Moreover, the AD converter includes a subtracting circuit SUB1 that calculates a difference between an output of the arithmetic circuit FSUB1 and an output of the arithmetic circuit FSUB2, an adder circuit AD1 that calculates a sum of the output of the arithmetic circuit FSUB1 and the output of the arithmetic circuit FSUB2, a subtracting circuit SUB2 that calculates a difference between an output of the adder circuit AD1 and a reference signal, and a first feedback circuit FB1 that amplifies an output from the subtracting circuit SUB2 and inputs the output to the oscillation circuit OSC1 and the oscillation circuit OSC2.

Furthermore, the AD converter includes a second feedback circuit FB2 that amplifies an output from the subtracting circuit SUB1 and inputs the output to the oscillation circuit OSC1 and the oscillation circuit OSC2, and an inverting circuit AMP that inverts polarity of the output received in the oscillation circuit OSC1 from the second feedback circuit FB2. The configurations of the above components are same as the first embodiment and the second embodiment, and therefore, the description therefor will be omitted.

Figure 9:
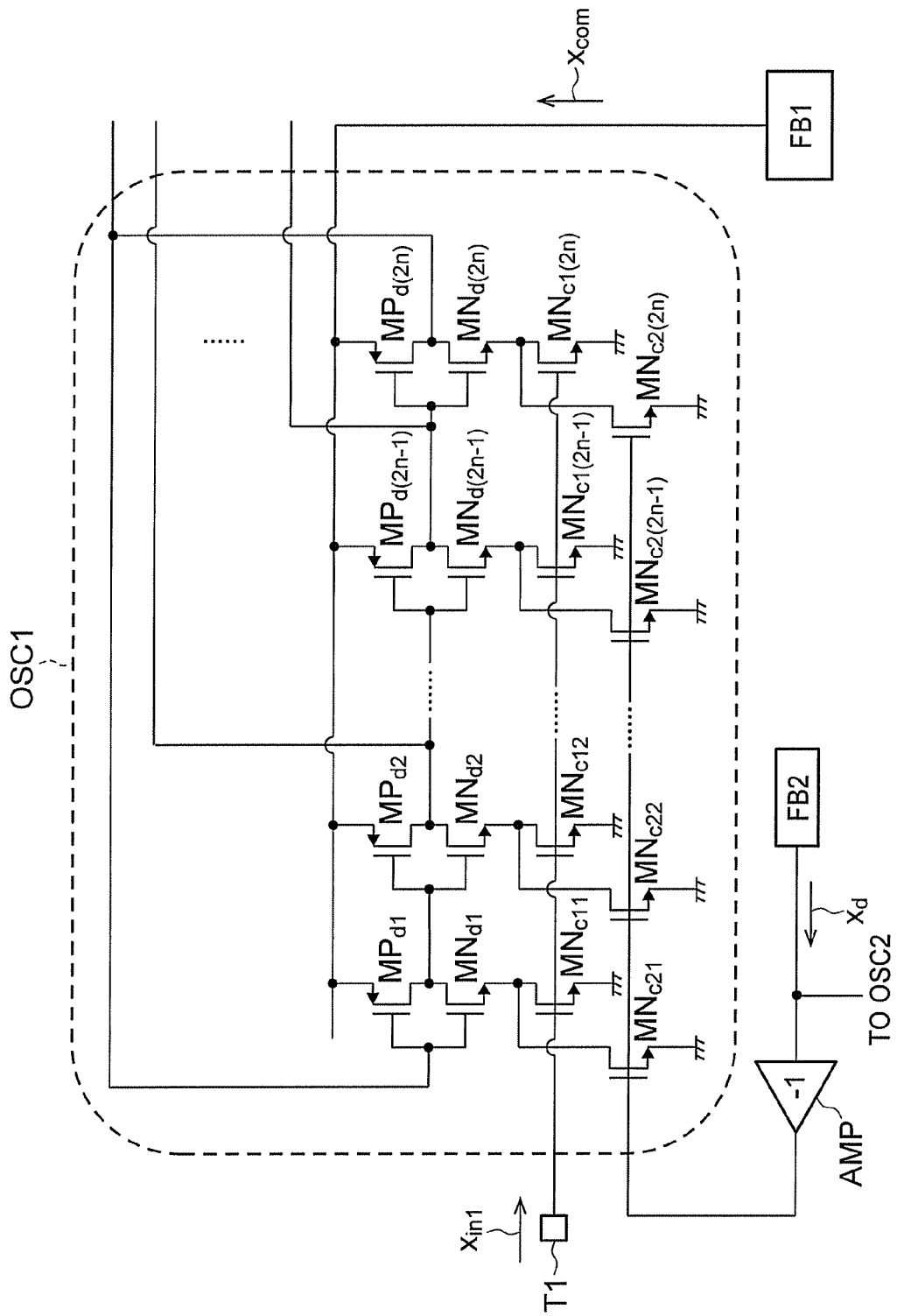
FIG. 9 is a diagram illustrating an exemplary circuit configuration of the oscillation circuit in FIG. 8.

FIG. 9 is a diagram illustrating an exemplary configuration of the oscillation circuit OSC1, first feedback circuit FB1, and second feedback circuit FB2 according to the present embodiment. As illustrated in FIG. 9, the oscillation circuit OSC1 is a ring oscillation circuit in which a control signal xcom from the first feedback circuit FB1 is received as power supply voltage for the inverter circuits formed by transistors MPdi (i=1 to 2n) and MNdi (i=1 to 2n), and a control signal xd from the second feedback circuit FB2 is received as gate voltage of a transistors MNc2i(i=1 to 2n).

With this configuration, even in the case where manufacturing variation is generated in the two oscillation circuits, the oscillation frequency of the oscillation circuits OSC1 and OSC2 can be controlled such that the digital signals xout1 and xout2 become the digital signals in which the signal component is superimposed on the predetermined bias component set by the reference signal nref. Further, even in the case where frequency offset is generated between the two oscillation circuits, the output signal xout for which the offset component xoffset is suppressed can be output. Therefore, performance variation of the AD converter can be suppressed.

Figure 10:
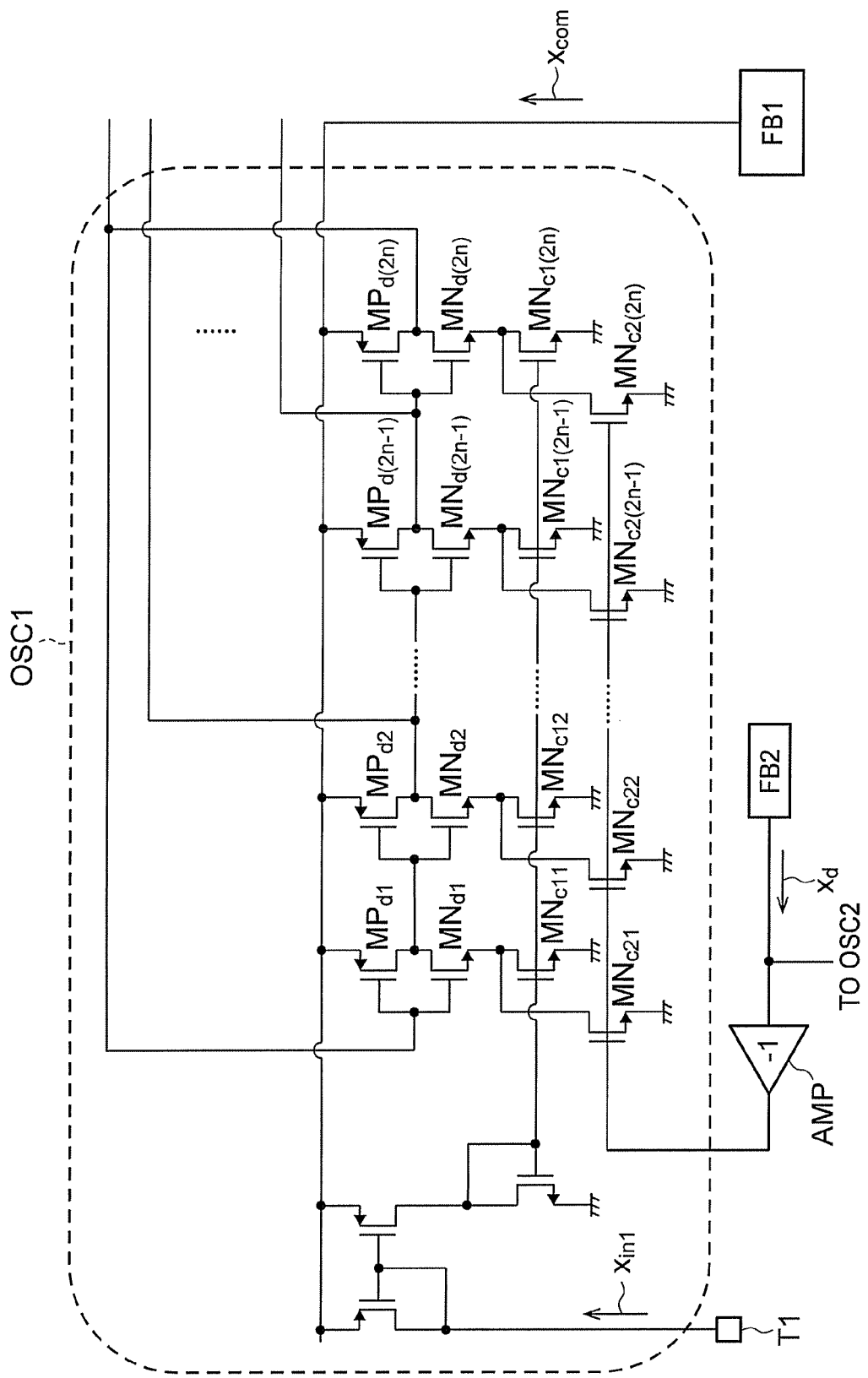
FIG. 10 is a diagram illustrating another exemplary circuit configuration of the oscillation circuit in FIG. 8.

Additionally, in FIG. 9, an input signal xin1 is received as gate voltage of transistors MNc1i(i=1 to 2n), but as illustrated in FIG. 10, it is also possible that the signal is returned by a current mirror circuit, and supplied as actuating current of the inverter circuit.

Figure 11:
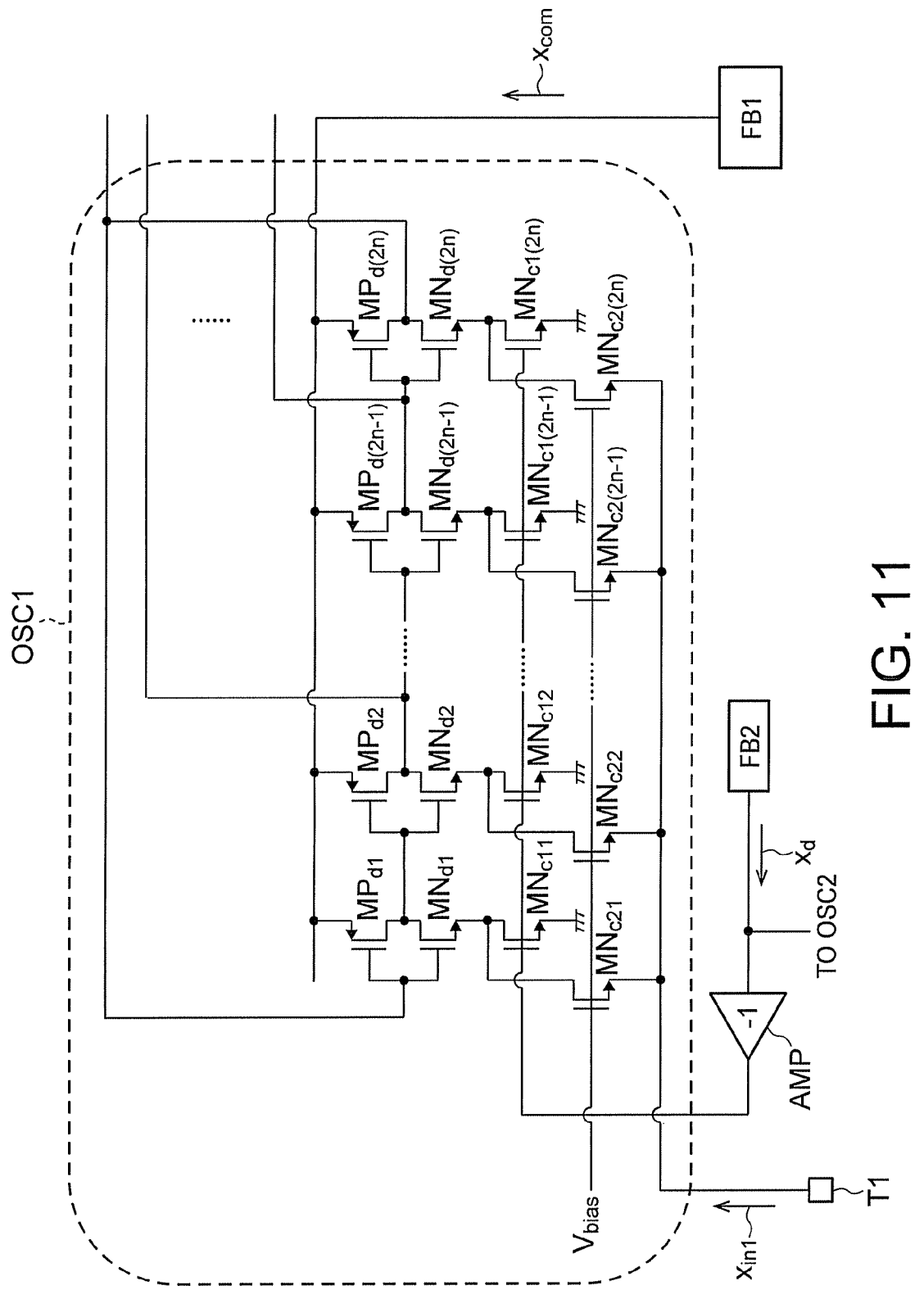
FIG. 11 is a diagram illustrating still another exemplary circuit configuration of the oscillation circuit in FIG. 8.

Also, as illustrated in FIG. 11, it is also possible that the input signal xin1 is supplied as the actuating current of the inverter circuit via a grounded-gate circuit including the transistors MNc2i(i=1 to 2n). In this case, predetermined bias voltage Vbias is applied to the transistors MNc2i(i=1 to 2n).

Figure 12:
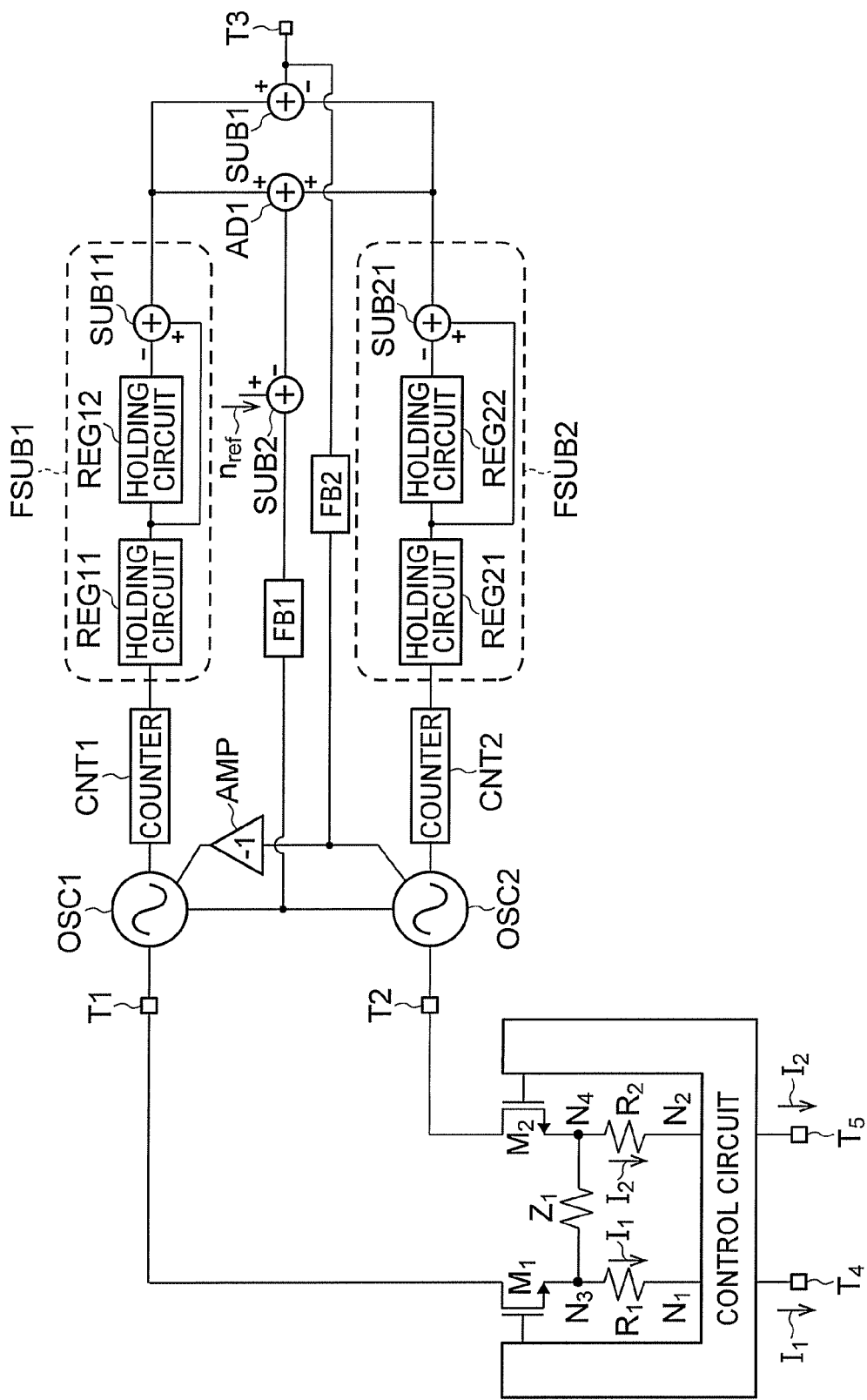
FIG. 12 is a diagram illustrating an exemplary AD converter including the amplifier circuit and according to the fourth embodiment.

Meanwhile, the AD converter according to the first embodiment to the fourth embodiment may include current amplification. FIG. 12 is a diagram illustrating an example of the AD converter according to the fourth embodiment including the amplifier circuit. As illustrated in FIG. 12, a terminal T1 of the oscillation circuit OSC1 and a terminal T2 of the oscillation circuit OSC2 are individually connected to the amplifier circuit. According to the present embodiment, current received from a terminal T4 and a terminal T5 of the amplifier circuit is amplified by the amplifier circuit, and received in the AD converter via the terminal T1 and the terminal T2.

The amplifier circuit illustrated in FIG. 12 includes a transistor M1, a transistor M2, a resistance R1 connected to a source terminal N3 of the transistor Ml, a resistance R2 connected to a source terminal N4 of the transistor M2, a control circuit, and an impedance element Z1 connected between the source terminal N3 of the transistor M1 and the source terminal N4 of the transistor M2. A drain terminal of the transistor M1 is connected to the terminal T1, and a drain terminal of the transistor M2 is connected to the terminal T2. The control circuit controls at least one of gate voltage of the transistor M1 and gate voltage of the transistor M2, thereby equalizing voltage at the other end N1 of the resistance R1 and the voltage at the other end N2 of the resistance R2. Also, the control circuit executes control such that current I1 received from the terminal T4 flows in the resistance R1 and current I2 received from the terminal T5 flows in the resistance R2.

In the following, operation of the amplifier circuit thus configured will be described. In the following description, it is noted that the current flowing in the respective components is indicated by attaching an index to I, and a current value of the current is indicated by the same reference sign. The voltage, resistance, and impedance are also indicated in the same manner. Specifically, the current value of the current I is indicated by I. Additionally, in the following, a description will be given for a case in which a differential signal is received from the terminal T4 and the terminal T5. However, at least one of the current received from the terminal T4 and the terminal T5 may be bias current that does not include a signal component.

The amplifier circuit receives current I1 from the terminal T4 and receives current I2 from the terminal T5. Here, it is noted that the current I1 and the current I2 are differential signals indicated as next: $I1=Ib(1+\Delta R)$ and $I2=Ib(1-\Delta R)$. Ib is a bias component and $Ib\Delta R$ is a signal component. In other words, $\Delta R$ indicates a ratio of the signal component contained in the current I1 and the current I2.

Since the voltage at the terminal N1 and the terminal N2 is controlled to become equal by the control circuit, voltage V3 at the source terminal N3 of the transistor M1 becomes: $V3=Vc+R1I1=Vc+R1Ib+R1Ib\Delta R$. Also, voltage V4 at the source terminal N4 of the transistor M2 becomes: $V4=Vc+R2I2=Vc+R2Ib-R2Ib\Delta R$. Here, note that Vc is the voltage at the terminal N1 and the terminal N2 controlled by the control circuit.

In the case of setting resistance values of the resistance R1 and resistance R2 to a same value RC, the voltage applied to the impedance element Z1 becomes $V3-V4=2RCIb\Delta R$, and current having a current value $2RCIb\Delta R/Z1$ flows. Therefore, the current having the following current value flows in the transistor $M1: I1+2RCIb\Delta R/Z1=Ib+\Delta RIb+2RCIb\Delta R/Z1$. Further, the current having the following current value flows in the transistor M2: $I2-2RCIb\Delta R/Z2=Ib-\Delta RIb-2RCIb\Delta R/Z1$. A sum of current values of the bias current received in the oscillation circuit OSC1 and the oscillation circuit OSC2 from the terminal T1 and the terminal T2 is indicated by the sum of the current values of the current flowing in the transistor M1 and the transistor M2, that is, 2Ib. This is equal to the sum of the current values of the bias current of the received current I1 and I2. On the other hand, a difference between the current values received from the terminal T1 and the terminal T2 becomes signal current (signal component), and a current value of the signal current becomes: $2\Delta RIb+4RCIb\Delta R/Z1$.

For instance, in the case where RC=4 k$\Omega$, $\Delta R=0.01$, IB=100 $\mu$A, and Z1=100$\Omega$, Q, the sum of the current values of the signal current at the time of input becomes: $2Ib\Delta R=2$ $\mu$A. Further, the sum of the signal values received from the terminal T1 and the terminal T2 becomes: $2\Delta RIb+4RCIb\Delta R/Z1=162$ $\mu$A. Therefore, the signal current is to be amplified to 81-fold at the amplifier circuit. In contrast, the current value of the bias current is kept at 200 $\mu$A, and therefore, the amplifier circuit does not increase the bias current and only the signal current is amplified to 162 $\mu$A. Therefore, the ratio between the bias current and the signal current can be increased, such as 0.81. Thus, the resolution of the AD converter can be improved by performing digital conversion after amplifying the signal current (signal component)

Meanwhile, the impedance element Z1 has been described as the resistance above, but the impedance element may be formed of the resistance and capacitance connected in parallel. In this case, when frequencies of the analog signals received from the terminal T4 and the terminal T5 are low, impedance of the impedance element depends on a resistance component, while the impedance element depends on a capacitance component when the frequencies are high. Thus, the amplifier circuit may have frequency characteristics.

Figure 13:
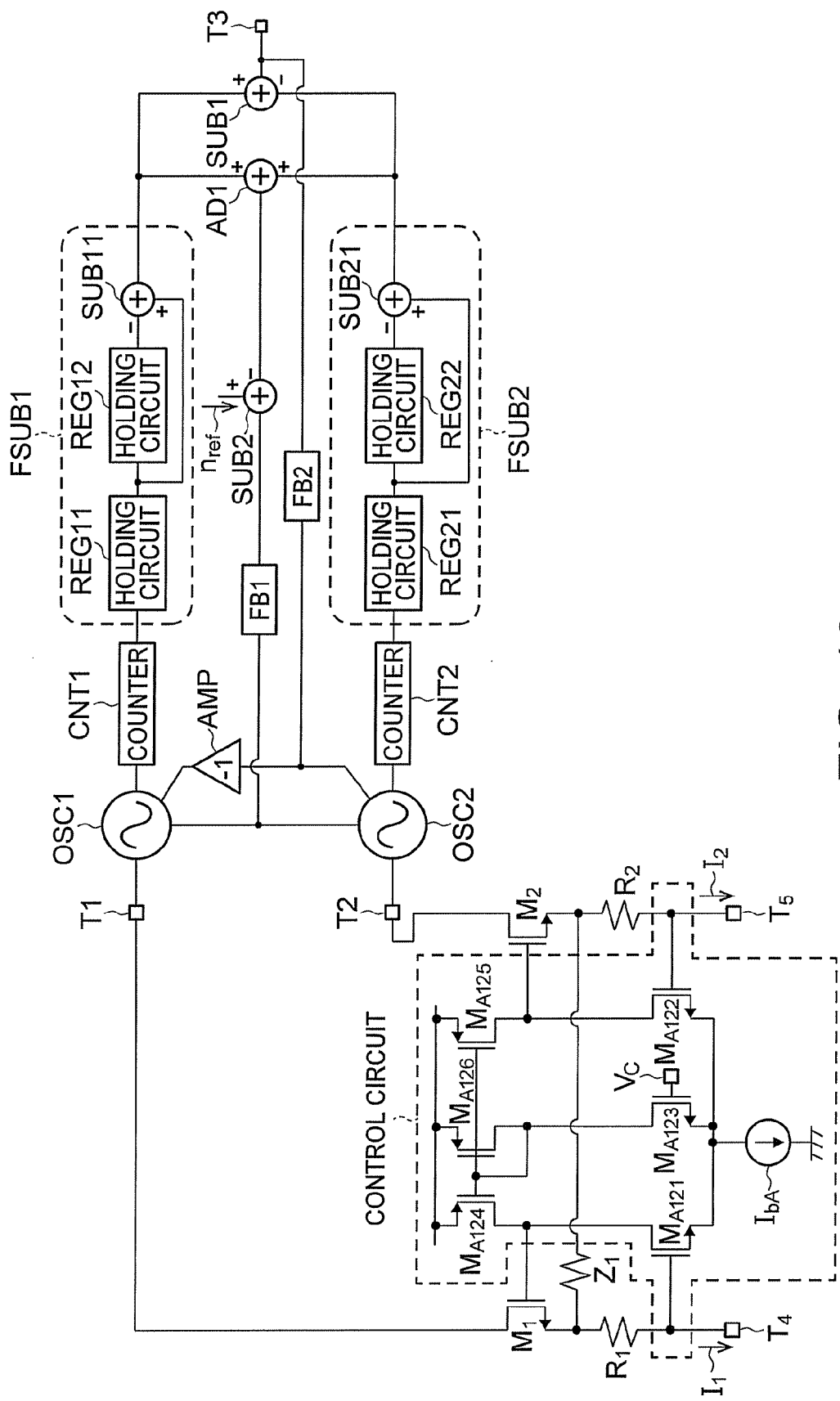
FIG. 13 is a diagram illustrating another exemplary AD converter including the amplifier circuit and according to the fourth embodiment.

FIG. 13 is a diagram illustrating a concrete example of the control circuit in FIG. 12. In FIG. 13, the control circuit is implemented by the amplifier circuit for differential input/ differential output, and includes transistors MA121 to MA126 and a current source IbA. In the case where common-mode voltage of a differential signal applied to a gate terminal of the transistor MA121 and a gate terminal of the transistor MA122 is higher than the voltage Vc applied to a gate terminal of the transistor MA123, common-mode feedback is to be performed such that the common-mode voltage of the differential signals to be received is lowered via the transistor M1 and the transistor M2. With this configuration, the control circuit can equalize the voltage at the other end N1 of the resistance R1 and the other end N2 of the resistance R2. Further, the control circuit executes control such that the current I1 received from the terminal 14 flows in the resistance R1 and the current I2 received from the terminal T5 flows in the resistance R2.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An AD converter, comprising:
a first oscillation circuit for generating a first pulse signal having a frequency corresponding to a level of a first analog signal;
a first counter for counting the first pulse signal generated by the first oscillation circuit;
a first arithmetic circuit for generating a first signal corresponding to a change amount of a count value of the first counter at a first predetermined time interval;
a second oscillation circuit for generating a second pulse signal having a frequency corresponding to a level of a second analog signal;
a second counter for counting the second pulse signal generated by the second oscillation circuit;
a second arithmetic circuit for generating a second signal corresponding to a change amount of a count value of the second counter at a second predetermined time interval;
a first subtracting circuit for outputting a digital signal corresponding to a difference between the first signal generated by the first arithmetic circuit and the second signal generated by the second arithmetic circuit;
an adder circuit for generating a sum signal of the first signal generated by the first arithmetic circuit and the second signal generated by the second arithmetic circuit;
a second subtracting circuit for generating a difference signal between the sum signal and a reference signal; and
a feedback circuit for amplifying the difference signal and input the difference signal to the first oscillation circuit and the second oscillation circuit.

2. An AD converter, comprising:
a first oscillation circuit for generating a first pulse signal having a frequency corresponding to a level of a first analog signal;
a first counter for counting the first pulse signal generated by the first oscillation circuit;
a first arithmetic circuit for generating a first signal corresponding to a change amount of a count value of the first counter at a first predetermined time interval;
a second oscillation circuit for generating a second pulse signal having a frequency corresponding to a level of a second analog signal;
a second counter for counting the second pulse signal generated by the second oscillation circuit;
a second arithmetic circuit for generating a second signal corresponding to a change amount of a count value of the second counter at a second predetermined time interval;
a subtracting circuit for outputting a digital signal corresponding to a difference between the first signal generated by the first arithmetic circuit and the second signal generated by the second arithmetic circuit;
a feedback circuit for amplifying a low-frequency component of the digital signal output from the subtracting circuit and input the low-frequency component to the first oscillation circuit and the second oscillation circuit; and
an inverting circuit for inverting polarity of the signal output from the feedback circuit and input the signal to the first oscillation circuit.

3. An AD converter, comprising:
a first oscillation circuit for generating a first pulse signal having a frequency corresponding to a level of a first analog signal;
a counter for counting the first pulse signal generated by the first oscillation circuit;
a first arithmetic circuit for outputting a first digital signal corresponding to a change amount of a count value of the counter at a first predetermined time interval;
a second oscillation circuit for generating a second pulse signal having a frequency corresponding to a level of a second analog signal;
a counter for counting the second pulse signal generated by the second oscillation circuit;
a second arithmetic circuit for outputting a second digital signal corresponding to a change amount of a count value of the counter at a second predetermined time interval;
a subtracting circuit for generating a difference signal between the second digital signal generated by the second arithmetic circuit and a reference signal; and
a filter unit for amplifying the difference signal generated by the subtracting circuit and input the difference signal to the first oscillation circuit and the second oscillation circuit.

4. The AD converter according to claim 1, wherein at least one of the first oscillation circuit and the second oscillation circuit is a ring oscillation circuit including a plurality of delay elements, and
the first counter and the second counter for counting the pulse signals generated by the ring oscillation circuit count the pulse signals output from the plurality of delay elements respectively.

5. The AD converter according to claim 2, wherein
at least one of the first oscillation circuit and the second oscillation circuit is a ring oscillation circuit including a plurality of delay elements, and the first counter and the second counter for counting the pulse signals generated by the ring oscillation circuit count the pulse signals output from the plurality of delay elements respectively.

6. The AD converter according to claim 3, wherein at least one of the first oscillation circuit and the second oscillation circuit is a ring oscillation circuit including a plurality of delay elements, and the first counter and the second counter for counting the pulse signals generated by the ring oscillation circuit count the pulse signals output from the plurality of delay elements respectively.

7. The AD converter according to claim 1, wherein the feedback circuit includes a lowpass filter.

8. The AD converter according to claim 2, wherein the feedback circuit includes a lowpass filter.

9. The AD converter according to claim 3, wherein the feedback circuit includes a lowpass filter.

10. The AD converter according to claim 2, wherein the feedback circuit includes an integrating circuit.

11. The AD converter according to claim 1, further comprising an amplifier circuit, wherein an analog signal amplified by the amplifier circuit is received in the first oscillation circuit and the second oscillation circuit.

12. The AD converter according to claim 2, further comprising an amplifier circuit, wherein an analog signal amplified by the amplifier circuit is received in the first oscillation circuit and the second oscillation circuit.

13. The AD converter according to claim 3, further comprising an amplifier circuit, wherein an analog signal amplified by the amplifier circuit is received in the first oscillation circuit and the second oscillation circuit.

* * * * *